United States Patent [19]
Hunsperger et al.

[11] 3,945,110
[45] Mar. 23, 1976

[54] METHOD OF MAKING AN INTEGRATED OPTICAL DETECTOR

[75] Inventors: Robert G. Hunsperger, Malibu; Harold M. Stoll, Sierra Madre; Gregory L. Tangonan; Amnon Yariv, both of Pasadena, all of Calif.

[73] Assignee: Hughes Aircraft Company, Culver City, Calif.

[22] Filed: Sept. 16, 1974

[21] Appl. No.: 506,498

Related U.S. Application Data

[62] Division of Ser. No. 390,836, Aug. 23, 1973, Pat. No. 3,873,828.

[52] U.S. Cl............... 29/572; 29/591; 250/211 J; 250/492 A; 350/96 WG; 357/30
[51] Int. Cl.²......................................... H01L 21/02
[58] Field of Search.......... 29/572, 578, 576 B, 579, 29/587, 590, 591; 357/29, 30, 31, 15; 148/1.5, 33.2, 175; 250/199, 211 R, 492 A, 213, 211 J; 427/38, 77, 84, 91; 350/96 T, 96 WG; 84/73 W, 95 R

[56] References Cited
UNITED STATES PATENTS

| | | | |
|---|---|---|---|
| 3,448,349 | 6/1969 | Sumner............................ | 427/84 X |
| 3,542,536 | 11/1970 | Flam et al...................... | 350/96 WG |
| 3,752,702 | 8/1973 | Tizuka et al......................... | 427/84 |
| 3,865,625 | 2/1975 | Cho et al.................... | 350/96 WG X |

*Primary Examiner*—Carl E. Hall
*Attorney, Agent, or Firm*—W. H. MacAllister; D. C. Keaveney

[57] ABSTRACT

There is disclosed an integrated optical detector comprising a semiconductor substrate having an optical waveguide formed integrally therewith and a photodetector made from the same semiconductor material as the waveguide and integrally coupled to it. The detector region is sensitive to light of the same wavelengths that can be transmitted through the waveguide region of the semiconductor without excessive absorption therein by virtue of the fact that after the waveguide is formed proton bombardment of the detector portion thereof is used to create optically active defect centers thereby shifting the effective absorption edge in the detector region. Where gallium arsenide is used as the semiconductor defect levels induced by implantation of high energy protons give rise to optical absorption between 6 micron and 0.9 micron. This results in detector action in the presence of a Schottkey barrier depletion layer. Detector response times less than 200 nanoseconds and external quantum efficiencies of 16 percent have been observed in the device.

5 Claims, 7 Drawing Figures

METHOD OF MAKING AN INTEGRATED OPTICAL DETECTOR

RELATED APPLICATIONS

This application is a division of Ser. No. 390,836 filed Aug. 23, 1973, on behalf of the same inventors and the assignees as are represented in this case now U.S. Pat. No. 3,873,828.

Certain fabrication procedures which may be used in the manufacture of devices of the type described herein have been disclosed and claimed in copending applications assigned to the same assignee as the present application. One of these applications entitled "High Energy Ion Implantation Process and Masking Method For Use with Same" was filed on Feb. 26, 1973, on behalf of Hugh L. Garvin and Robert G. Hunsperger and was assigned Ser. No. 335,966. Another application entitled "Optical Waveguide and Modulator and Process for Fabricating Same" was filed on Mar. 28, 1973, on behalf of Robert G. Hunsperger and Gordon A. Shifrin and assigned Ser. No. 345,625. Still another application entitled "Process for Fabricating Small Geometry Semi-conductive Devices Including Integrated Optical Components" was filed on Feb. 28, 1973, on behalf of Hugh L. Garvin, Ammon Yariv, and Sasson Somekh and assigned Ser. No. 336,679.

Certain related processes and devices are also disclosed and claimed in an application similarly assigned and filed June 29, 1973 on behalf of Gordon A. Shifrin and Robert G. Hunsperger and entitled "Monolithic Planar Opto-Isolators and Processes for Fabricating Same".

FIELD OF THE INVENTION

This invention relates to an integrated optical detector suitable for use in integrated circuits wherein the signal is at optical frequencies. The terms "optical frequencies" or "light" are herein used to include the infared, the visible, and the ultraviolet regions of the spectrum. The general field of integrated optics has been discussed, for example, in a published article entitled "Integrated Optics — An Introduction" by S. E. Miller in the Bell Systems Technical Journal (BSDJ) September, 1969, Vol. 48, pp. 2059–2069.

BACKGROUND OF THE INVENTION

The above noted Miller paper outlined a proposal for a miniature form of laser beam circuit or, more generally, for integrated circuit devices wherein the signal energy is transmitted at optical frequencies by coherent light. Such circuits are formed by fabricating regions in glass or semiconductor substrates having desired geometries and transmissive properties. It was, for example, noted that index of refraction changes of the order of $10^{-2}$ or $10^{-3}$ in such a substrate allow guided laser beams of widths near 10 microns. It was proposed that photolithographic techniques would permit simultaneous construction of complex circuit patterns and devices.

The patent literature indicates various attempts at practical experimental realization of such devices. Such United States patent as U.S. Pat. No. 3,465,159 issued Sept. 2, 1969 to Stern; U.S. Pat. No. 3,610,727 issued Oct. 5, 1971 to Ulrich; U.S. Pat. No. 3,617,109 issued Nov. 2, 1971 to Tien; and U.S. Pat. No. 3,631,360 issued July 10, 1970 to Lehovec, are typical of circuits and devices of the type being considered.

The patent to Ulrich, for example, is primarily directed to an arrangement for coupling a laser beam into or out of a thin film light guide with high coupling efficiency. The patent broadly suggest that the thin film light guide, or waveguide, may have as a smooth extension thereof a "utilization circuit" for the light and alleges (without any supporting detailed disclosure) that with appropriate doping and/or appropriate electrodes (not shown) the utilization circuit can be made to fulfill any of a wide variety of useful functions "such as light modulation, amplification, frequency conversion or detection".

If an operative fabrication technique is found, the advantage of such a device wherein the utilization circuit is, for example, a detector, is that it is integrally coupled to the waveguide thus eliminating the usual coupling loss that occurs when a discrete detector is used. Also, such a device is compatible with other optical integrated circuit elements that can be formed in a semiconductor substrate such as light emitting diodes, modulators, and other waveguides.

The problem which in the past has prevented the actual fabrication of such proposed integrally coupled devices, is that any light which is transmitted unattenuated through a waveguide formed in a semiconductor substrate cannot be sensed by an integral detector made of the same semiconductor material. The only actual solution to this problem which in the past has been even vaguely suggested in Ulrich's proposal to dope a selected portion of the waveguide. In a gallium arsenide substrate such doping could presumably be achieved with substitutional atoms of such elements as indium or thallium which would cause a decrease in the band gap energy. The doped region is then, however, no longer the "same semiconductor material" since various intentionally provided impurities exist in a region the geometry of which is very difficult to control. Such doping could possibly be achieved by diffusion or epitaxial growth but it would obviously be very difficult to perform and does not lend itself to the fabrication of devices having very precisely controlled minute geometries.

SUMMARY OF THE INVENTION

The foregoing problem is overcome in the present invention by using proton bombardment to create in the already formed waveguide an active detector volume with an absorption edge at longer wavelengths than that characteristic of the non-bombarded semiconductor waveguide region. After a waveguide is formed in a semiconductor such as gallium arsenide the preselected photodetector region thereon is irradiated with protons to create optically active defect centers in the gallium arsenide itself at the detector location thereby shifting the effective absorption edge of the pure gallium arsenide from a wavelength of approximately 0.9 micron to greater than 6 micron. Thus, the detector is made sensitive to light of wavelengths that can be transmitted through the waveguide formed of the same material without excessive absorption. A surface barrier or Schottkey diode type electrode comprising a metal film is then provided which is reverse biased in order to sense the photocurrent resulting from light transmitted through the waveguide to the detector.

BRIEF DESCRIPTION OF THE DRAWINGS

FIG. 1a is a graph indicating the directions of the x, y and z axes assumed in the discussion and giving a plot of the density of proton implantation caused damage having its value indicated along the z axis as a function of depth in the waveguide plotted along the x axis;

THE INVENTION

The ultimate goal of completely monolithic integrated optical circuits for use in data processing and communication requires that the individual components of such devices be easily fabricated to the desired microcircuit geometries and dimensions on a common substrate. The technique of ion implantation has been used effectively to produce large scale integrated electronic circuits and lends itself naturally to the production of analogous optical circuits. Various forms of this technique have been disclosed in the prior art.

For example, P-N junction diodes in gallium arsenide have been formed by zinc and cadium implantation of N-type gallium arsenide as described by R. G. Hunsperger et al. in "Metallurgical Transactions" Vol. 1, p. 603 (1970). $Ga_{(1-x)}Al_xAs$ electroluminescent diodes have been made by the sequential implantation of zinc and aluminum into N-type gallium arsenide as disclosed by R. G. Hunsperger et al. in "Applied Physics Letters" Vol. 19, p. 327 (1971). Type conversion caused by proton implantation of InSb ZnTe has been used in the manufacture of N-P junction photodetectors and MIS electroluminescent diodes as described by A. G. Foyt et al. in "Applied Physics Letters" Vol. 16, p. 335 (1970) and J. P. Donnelly et al. in "Solid State Electronics" Vol. 13, p. 755 (1970).

Particular forms of this technique especially suitable for fabrication of the device disclosed herein in its various modifications have been disclosed in two of the above-referenced copending applications, Ser. Nos. 335,966 and 336,679.

There is disclosed herein waveguide devices and a process of fabrication thereof by proton implantation of gallium arsenide which are improvements over the device and process described in copending application Ser. No. 345,625 cited above. As used herein the term "ion implantation" unless otherwise indicated, includes such proton implantation as a special case thereof by virtue of the fact that a proton is by commonly accepted definition a positively charged hydrogen ion.

Figure 1:
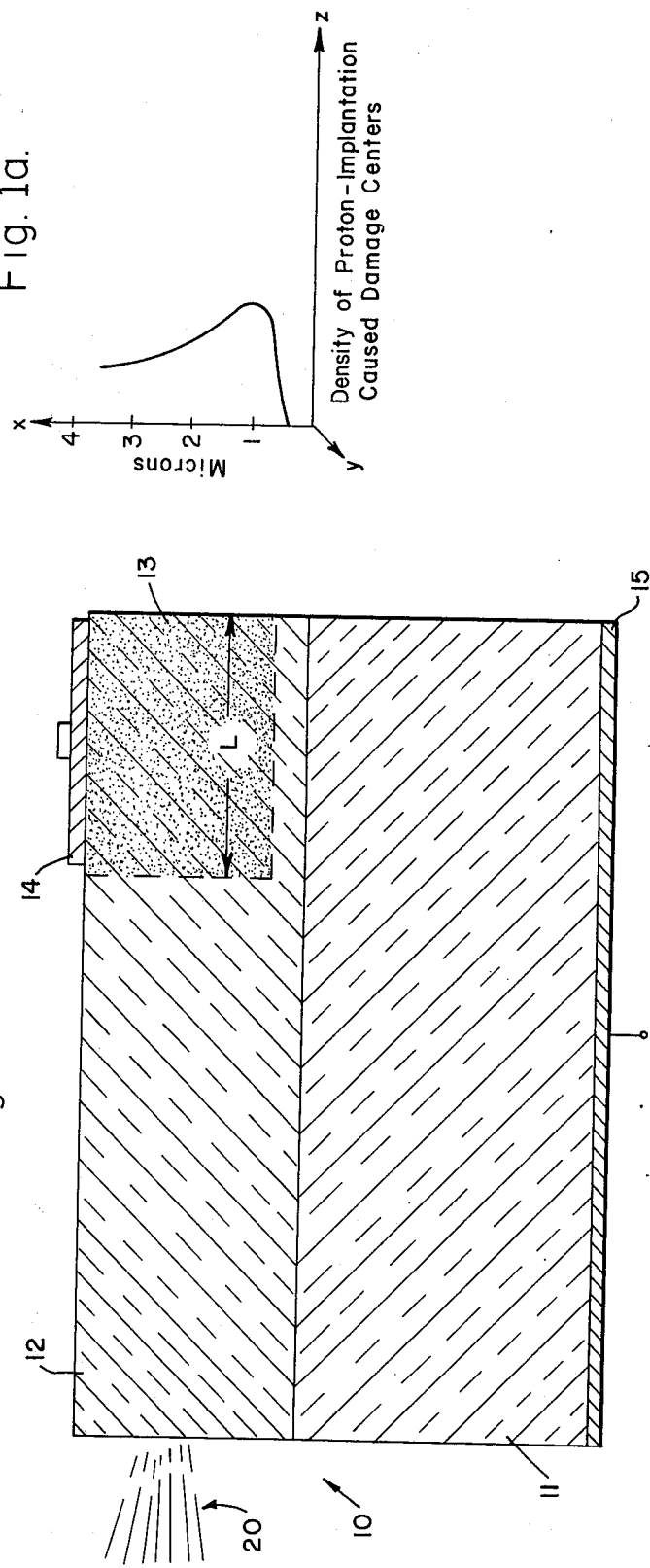
FIG. 1 is a sectional view, partially schematic, taken on the line 1—1 of FIG. 2, through a typical integrated optical waveguide and detector in accordance with the present invention.
Figure 2:
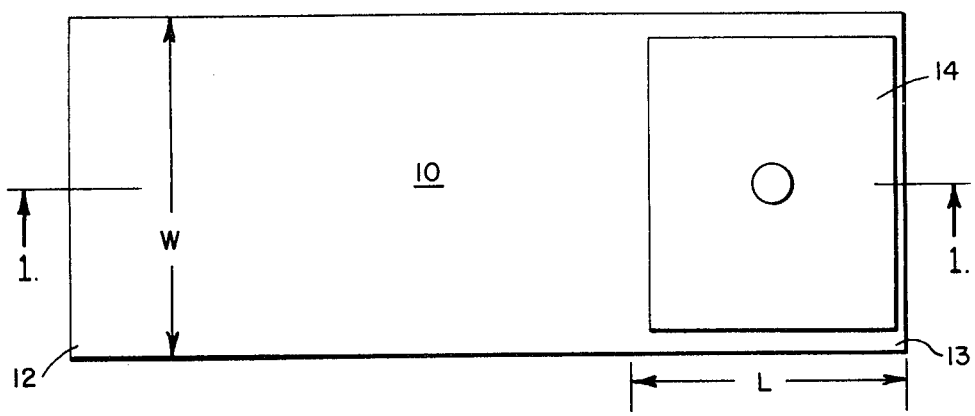
FIG. 2 is a plan view taken in the y-z plane of the top surface of the waveguide-detector of which a section taken in the x-z plane is shown in FIG. 1.

The integrated optical detector 10 of the present invention is shown in top plan view of FIG. 2 and in FIG. 1 in a sectional view taken along the line 1—1 of FIG. 2. The device consists of a substrate 11 on or in which a waveguide 12 may be formed by any convenient means such as any of the processes discussed above or by epitaxial deposition. It is preferred, however, to form the waveguide by the proton implantation process disclosed in copending application Ser. No. 345,625. In this process a gallium arsenide substrate is cut and polished and the waveguide is formed by proton irradiation of the upper surface of the entire device which in turn is followed by annealing to induce the desired waveguide transmission properties. After the waveguide is thus formed, an active detector volume 13 is formed in a portion thereof by further selective proton irradiation to produce the active defective levels necessary for detector action.

It will, of course, be understood that the dimensions of the structure can be varied to suit any particular application. The waveguide depth in FIG. 1a is shown at the typical value of 3.5 microns. The width, W, of the waveguide 12 indicated in FIG. 2 was in one device given a value of 3 microns with the length, L, of the active detector volume 13 having a value of approximately 6 microns. Such an elongated narrow detector-waveguide configuration has been referred to as a "channel" waveguide and is not shown to scale in FIG. 2. The scale of FIG. 2 implies a larger "planar waveguide configuration" wherein the length L, of the detector was approximately 0.2 cm and the width W, of the waveguide and the detector was 0.3 cm. Such a larger planar waveguide is particularly useful in applications where it is intended to interface with a bundle of optical fibers. If the barrier contact 14 (to be described below) of such device is made transparent, the planar configuration may be used for detection of light incident externally to the device. In any event, it will be understood that the device can be manufactured to any desired dimensions or configuration in accordance with the fabrication techniques disclosed in the above-noted copending applications Ser. Nos. 335,966 and 336,679. In whatever configuration the device is formed, however, once the waveguide has been formed on the substrate and the active detector volume has been formed in the waveguide, an ohmic contact layer 15 such as a metal film is deposited on the bottom surface of the substrate and a Schottkey barrier contact 14 is deposited on the upper surface of the detector volume 13. The ohmic contact 15 may be an alloy of gold and germanium. The Schottkey barrier contact may, for example, be a film of aluminum or gold or other suitable metal.

In operation the Schottkey barrier 14 is reverse biased by a suitable voltage source. Photocurrent is generated when the photons of the guided light waves 20 are transmitted through the waveguide 12 and reach the detector area where they excite electrons out of the deep level traps that have been created in the detector volume by proton bombardment. The fact that the detector volume is integrally coupled to the waveguide eliminates the usual coupling loss that occurs when a discrete detector is used. Furthermore, the device as shown is compatible with other optical integrated circuit elements that can be formed in a semiconductor substrate such as light emitting diodes, modulators, and additional waveguide patterns.

In a particular exemplary embodiment of a phototype test unit fabricated in accordance with the teaching above as shown in FIGS. 1 and 2, the optical waveguide structure 12 consisted of a 3.5 micron thick N-type (S-dopant about $10^{16}/cm^3$) epitaxial film grown on a degenerate N-type substrate ($1.25 \times 10^{18}/cm^3$). The guide substrate refractive index discontinuity generated by the plasma depression effect allowed good optical confinement for the particular guide thickness used. Optical attenuation before proton implantation was measured to be 1.3 cm$^{-1}$ and could be accounted for by consideration of free carrier substrate penetration losses. Subsequently, the waveguide surface was exposed to 300 keV proton irradiation the total integrated flux of which was 2 × 10$^{15}$/cm$^2$. The damage layer produced was approximately 3 micron thick with a peak at about 2.5 micron as shown in the graphical plot of FIG. 1a.

Small rectangular samples were then cleaved from the large proton implanted specimen and examined for optical waveguiding. The source used in the examination was a SpectraPhysicas model 120 hellium-neon laser emitting at 1.15 microns. No waveguided light could then be detected at the output face of even the shortest (10 mil) sample showing that proton irradiation alone creates a very lossy waveguide or, in other words, a good detector as desired. For test purposes the samples were then annealed at 450°C for 30 minutes and optical losses were then observed to be 35 cm$^{-1}$; a further reduction in loss to approximately 15 cm$^{-1}$ was achieved after annealing for 30 minutes at 500°C. It was thus confirmed that proton irradiation induced optical attenuation can be reduced by annealing. The losses measured after the above-noted proton irradiation were based on comparison to measurements of negligible loss in the epitaxially grown waveguide structure prior to the initial proton irradiation. As noted, these losses were reduced by the annealing treatment demonstrating that the waveguide could initially be formed in this fashion as well as by epitaxy. In commercial practice, of course, the selective proton bombardment by which the detector is formed would not be followed by annealing. The selector proton bombardment is preferably carried out by the masking techniques disclosed in the above noted copending applications.

It will be understood that there is in practice no sharp cutoff point in the degree of loss which leads one to change the terminology of a "lossy waveguide" to that of a "detector". The less loss one has the better waveguide one has: the more loss one has, the better detector one has. In order to demonstrate the principles of operation of these devices, measurements were made on samples cleaved from the above-noted waveguide after the initial proton irradiation and after initial annealing respectively at 450° and 500°C for 30 minutes each. Such annealing is not sufficient to eliminate all optical losses so that the samples functioned both as lossy waveguides and as detectors. On the surfaces of these samples 11 mm square aluminum Schottkey barriers were evaporated in a waffle pattern. Room temperature experimental results are given for the material annealed at 500°C. The aluminum barrier-guide substrate structures were used to measure detector pulse response and external quantum efficiency. Transparent gold barriers sputter deposited on material of identical radiation and heat treatment history were used to measure photosensitivity as a function of wavelength.

Figure 3:
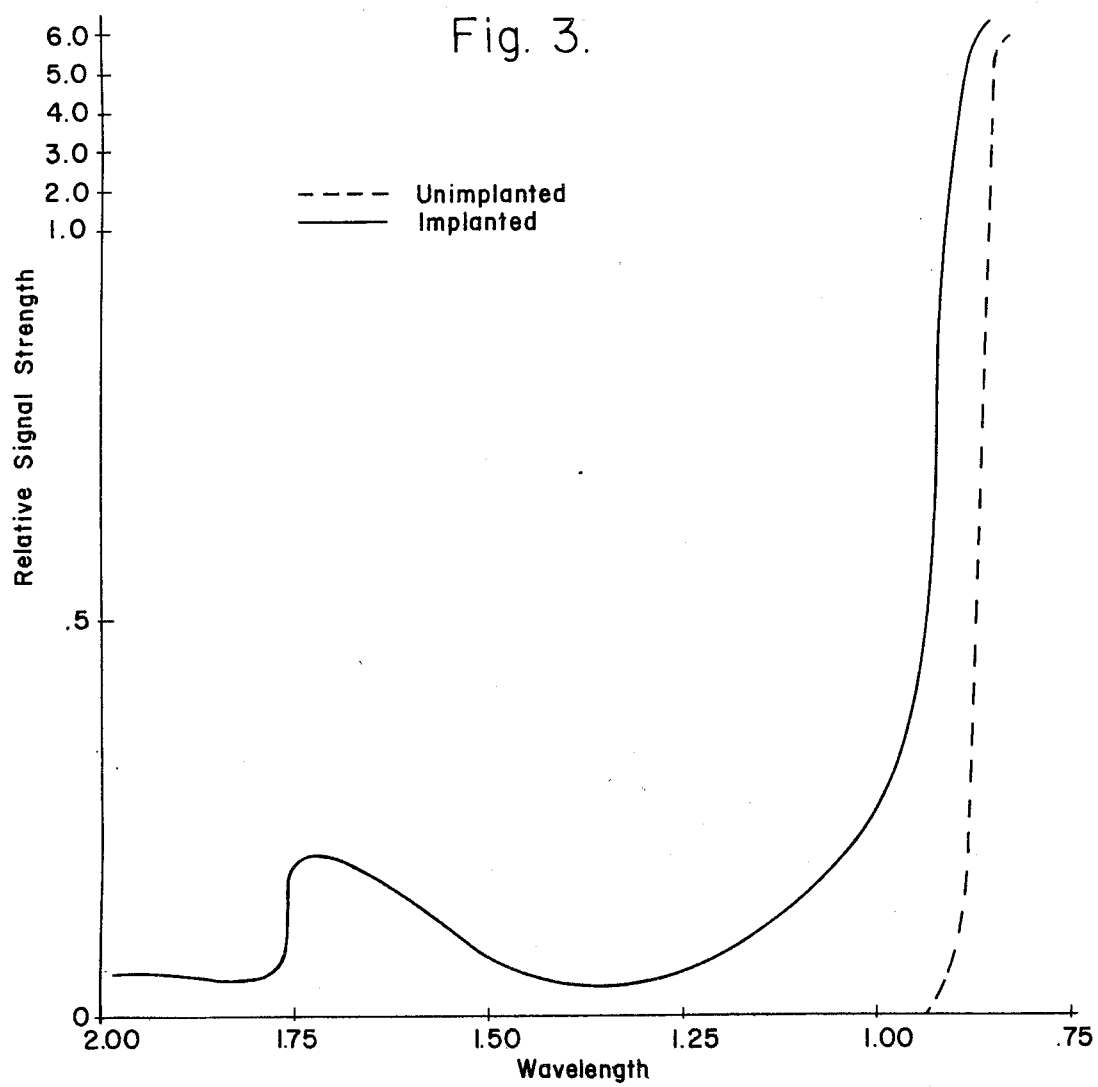
FIG. 3 is a graph showing measurements of the sensitivity of both unimplanted and implanted annealed samples.
Figure 4A:
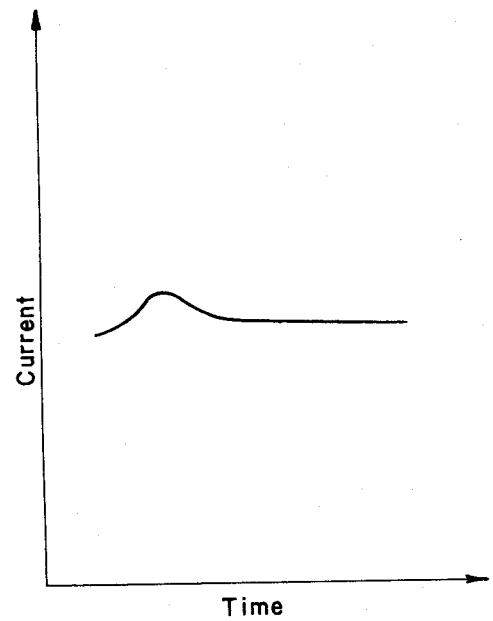
FIG. 4a is a graph showing the pulse response time of the implanted detector.
Figure 4B:
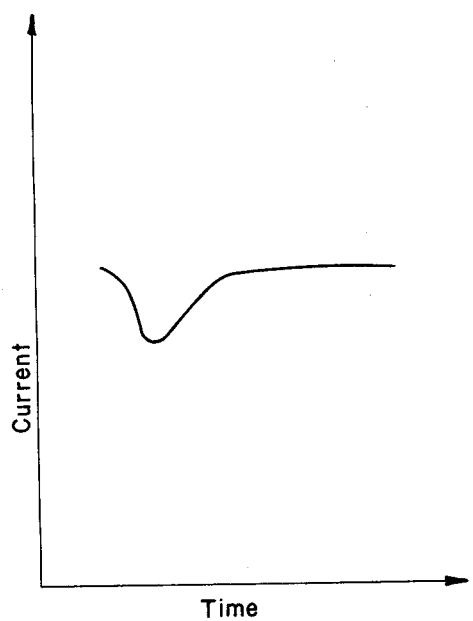
FIG. 4b is a similar graph showing the comparable pulse response time of a commercially available detector.

The detector response measurement are shown in FIGS. 4a and 4b whereas the wavelength response measurements are shown in FIG. 3. In both cases substrate surfaces were provided with a gold-germanium alloyed ohmic layer for contact 15.

The principal of operation is similar to that of conventional P-N or P-I-N junction photodetectors. Upon application of a reverse bias to the Schottkey barrier, a depletion region is formed in the optical guiding layer. Any dipole transitions made possible by radiation produced defect levels generate free carriers which are swept out of the depletion layer. By insuring that the radiation induced damage extends over most of the waveguiding layer and choosing epitaxial material of high purity, or, preferably, by forming the waveguide originally by proton implantation in accordance with the teaching of copending application Ser. No. 345,625, maximum efficiency can be obtained over a given interaction length. Detector response times less than 200 nanoseconds and external quantum efficiencies of 16 percent were experimentally observed.

Measurements of the photosensitivity of both unimplanted and implanted annealed samples are shown in FIG. 3. The curve for the implanted sample reveals a defect-associated energy level lying 0.7 electron volt above the valence band edge of an apparent shift of the conduction band edge to lower energies. Calorimetric measurements made on proton irradiated gallium arsenide at 1.06 micron as known in the published literature indicate that substantially all of the damage induced optical attenuation in the one micron wavelength region can be attributed to absorption as opposed to diffuse scattering. The origin of this absorption is thought to be the disorder-induced band tailing. However, the possibility that it is due, at least in part, to excitation of electrons from energy levels associated with As (or Ga) vacancy complexes is strong, particularly in view of the fact that free carrier compensation by proton implantation appears to be Fermi-level dependent.

The measurement of detector rise and fall times at 1.06 micron was made using an acoustically Q-switched Nd:YAG laser. The pulse response of the implanted detector is shown in FIG. 4a and is compared to that of a commercial germanium detector as shown in FIG. 4b. The commercial detector was a Philco L4521 detector. In both cases the rise and fall times appeared to be about 200 nanoseconds and 400 nanoseconds respectively. Reducing the size of the load resistors used merely decreased the signal strength. The pulse shapes remained the same. Since the germanium detector response is in the GHz range, it was concluded that the rise and fall times measured were a function of the Q-switched laser and did not represent limits of the implanted detector.

Figure 5:
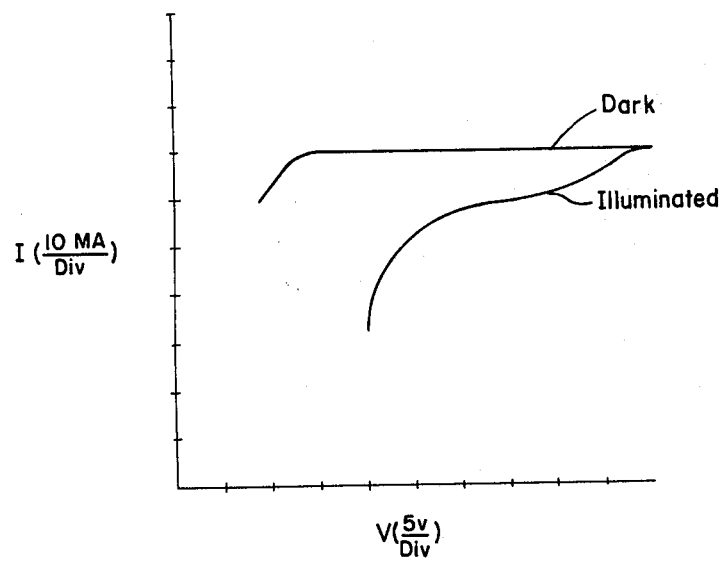
FIG. 5 is a graph showing current versus voltage curves for a reverse biased implanted detector of the present invention under dark conditions and under illumination by 1.15 micron radiation.

FIG. 5 shows I-V curves for a reverse biased implanted detector under dark conditions and under conditions of illumination by 1.15 micron radiation. The measured external quantum efficiency at 1.15 microns, 294°K and a reverse bias of 20 volts was about 16 percent. In commercial practice this number would increase as optimal proton damage profiles and heat treatment conditions are approached for a given waveguiding detector geometry and configuration.

What is claimed is:

1. In a process of fabricating an integrated optical device which includes the step of forming a light transmissive waveguide in a semiconductor substrate, the improvement comprising:
   a. proton irradiating a selected portion of said waveguide to form an active photodetector region integral with said waveguide by creating optically active defeat centers in said region to thereby shift the effective wavelength absorption edge therein to render said photodetector region sensitive to light of wavelengths that can be transmitted through said waveguide; and b. forming a Schottkey barrier diode type electrode on the proton irradiated region and an ohmic contact electrode on said substrate.

2. A process as in claim 1 wherein said Schottkey barrier electrode is formed by evaporation deposition of metal.

3. A process as in claim 2 wherein said metal is aluminum and said waveguide is formed of gallium arsenide.

4. A process as in claim 1 wherein said Schottkey barrier electrode is formed by evaporation deposition of a transparently thin metallic layer.

5. A process as in claim 4 wherein said metal is gold and said waveguide is formed of gallium arsenide.

* * * * *